(12) United States Patent
Tang et al.

(10) Patent No.: US 10,604,699 B2
(45) Date of Patent: Mar. 31, 2020

(54) ORGANIC RARE EARTH SOLID MICELLE, PREPARATION METHOD THEREFOR, AND METHOD FOR INCREASING PHOTOELECTRIC CONVERSION EFFICIENCY OF SOLAR BATTERY

(71) Applicant: Qingdao University, Qingdao, Shandong Province (CN)

(72) Inventors: Jianguo Tang, Qingdao (CN); Die Wang, Qingdao (CN); Wenfei Shen, Qingdao (CN); Xinzhi Wang, Qingdao (CN); Yao Wang, Qingdao (CN); Linjun Huang, Qingdao (CN); Jixian Liu, Qingdao (CN); Jiqing Jiao, Qingdao (CN); Yanxin Wang, Qingdao (CN); Wei Wang, Qingdao (CN); Xiaolin Zhang, Qingdao (CN); Fanchen Bu, Qingdao (CN); Jing Wang, Qingdao (CN); Yan Song, Qingdao (CN); Huihui Yang, Qingdao (CN); Xingqin Xu, Qingdao (CN); Laurence A. Belfiore, Fort Collins, CO (US)

(73) Assignee: Qingdao University, Qingdao, Shandong (CN)

( * ) Notice: Subject to any disclaimer, the term of this patent is extended or adjusted under 35 U.S.C. 154(b) by 0 days.

(21) Appl. No.: 16/068,455

(22) PCT Filed: Aug. 9, 2016

(86) PCT No.: PCT/CN2016/094129
§ 371 (c)(1),
(2) Date: Jul. 6, 2018

(87) PCT Pub. No.: WO2017/118015
PCT Pub. Date: Jul. 13, 2017

(65) Prior Publication Data
US 2019/0010389 A1  Jan. 10, 2019

(30) Foreign Application Priority Data

Jan. 6, 2016 (CN) .......................... 2016 1 0004793

(51) Int. Cl.
*C09K 11/06* (2006.01)
*B01J 13/00* (2006.01)
(Continued)

(52) U.S. Cl.
CPC .............. *C09K 11/06* (2013.01); *B01J 13/00* (2013.01); *C08F 293/005* (2013.01);
(Continued)

(58) Field of Classification Search
CPC .......... H01L 51/0089; C09K 11/06–07; C09K 11/77–7798
See application file for complete search history.

(56) References Cited

U.S. PATENT DOCUMENTS

2013/0011864 A1* 1/2013 Wang .................... C07D 403/14
435/7.92
2018/0318455 A1* 11/2018 Mingotaud .......... A61K 9/0019

FOREIGN PATENT DOCUMENTS

CN  101475182 A  7/2009
CN  101901872 A  12/2010
(Continued)

OTHER PUBLICATIONS

Written Translation of Li et al, Engineering Plastics Application, 2012, vol. 40, pp. 17-21. (Year: 2012).*
(Continued)

*Primary Examiner* — Stephen E Rieth
(74) *Attorney, Agent, or Firm* — Andrus Intellectual Property Law, LLP

(57) ABSTRACT

Provided are an organic rare-earth solid micelle, a preparation method therefor, and a method for increasing the
(Continued)

photoelectric conversion efficiency of a solar battery. A small organic conjugated ligand is taken as a first ligand, an amphiphilic diblock polymer is taken as a second ligand, and the first ligand and the second ligand are mixed and doped with a rare-earth chloride solution, and self-assembled to form an organic rare-earth solid micelle, whereby the fluorescence emission intensity and the fluorescence efficiency of the rare-earth element are improved. Next, the prepared organic rare-earth solid micelle is spin coated on an ITO layer of a solar battery, to prepare a solar battery with the organic rare-earth solid micelle. Therefore the sunlight absorption of a cell is increased, and the photoelectric conversion efficiency is improved. The preparation process is simple, low in cost, high in photoelectric conversion efficiency, and environmentally friendly.

5 Claims, 3 Drawing Sheets

(51) Int. Cl.
    *C08F 293/00*     (2006.01)
    *H01L 51/00*     (2006.01)
    *H01L 51/44*     (2006.01)
    *H01L 51/42*     (2006.01)

(52) U.S. Cl.
    CPC ........ *H01L 51/0003* (2013.01); *H01L 51/004* (2013.01); *H01L 51/0021* (2013.01); *H01L 51/0035* (2013.01); *H01L 51/0037* (2013.01); *H01L 51/0043* (2013.01); *H01L 51/0047* (2013.01); *H01L 51/0089* (2013.01); *H01L 51/442* (2013.01); *C08F 2438/03* (2013.01); *C08F 2810/00* (2013.01); *C09K 2211/1092* (2013.01); *C09K 2211/14* (2013.01); *C09K 2211/182* (2013.01); *H01L 51/4253* (2013.01); *H01L 51/447* (2013.01); *H01L 2251/308* (2013.01)

(56) References Cited

FOREIGN PATENT DOCUMENTS

| CN | 101901873 A | 12/2010 |
|---|---|---|
| CN | 102875750 A | 1/2013 |
| CN | 103560207 A | 2/2014 |
| CN | 104064673 A | 9/2014 |
| CN | 105440230 A | 3/2016 |

OTHER PUBLICATIONS

International Search Report and Written Opinion for International Application No. CPCT/CN2016/094129 dated Oct. 25, 2016.
Wang, Die et al. Morphology and Luminescent Properties of Solid Micelles based on Europium(III) Complexes with Diblock Copolymers of Methyl Methylacrylate and Acrylic Acid. Ferroelectrics, Sep. 2015,vol. 486, pp. 91-105.
Extended European Search Report for corresponding European Patent Application No. 16883148.5 dated Nov. 7, 2018.
Chinese Office Action and Search Report for Chinese Patent Application No. 201610004793.3 dated Jul. 5, 2017.
Li, Aihua et al. Synthesis of Amphiphilic Block Copolymer by RAFT Polymerization and It's Induced Self-Assembly, Enginnering Plastics Application, 2012, vol. 40,No. 5, pp. 17-21.
Xu, Qingsong et al. Eu3+-induced aggregates of diblock copolymers and their photoluminescent property, Journal of Colloid and Interface Science, 2013, vol. 394, pp. 630-638.
First Office Action issued for Chinese Patent Application No. 2016100047933, dated Jan. 6, 2016.

* cited by examiner

ORGANIC RARE EARTH SOLID MICELLE, PREPARATION METHOD THEREFOR, AND METHOD FOR INCREASING PHOTOELECTRIC CONVERSION EFFICIENCY OF SOLAR BATTERY

CROSS-REFERENCE TO RELATED APPLICATIONS

This application is the U.S. national phase application of international application Serial No. PCT/CN2016/094129, filed Aug. 9, 2016, which claims priority from Chinese application Serial No. CN 201610004793.3, filed Jan. 6, 2016, the contents of each of which are incorporated herein in their entirety.

FIELD OF THE INVENTION

The present invention relates to a cross field of hybrid material technology and solar battery fabrication technology, and particularly to an organic rare earth solid micelle, a preparation method therefor, and a method for increasing the photoelectric conversion efficiency of a solar battery.

DESCRIPTION OF THE PRIOR ART

Rare earth luminescent materials are a new class of functional materials with promising future. Since the achievement of high purity of rare-earth oxides in the 1960s, rare earth luminescent materials have made major breakthroughs and are widely used in the lighting, display and detection areas, with which large-scale industrial production and consumer market are formed, and which are currently spread toward new areas. Among the rare earth luminescent materials, the function and application technology of organic rare-earth solid micelles are important research topics in chemistry and chemical engineering in the 21st century, and luminescence is the most prominent function among the three functions of the organic rare-earth solid micelles in optics, electrics, and magnetics. Therefore, the research and application of the organic rare-earth solid micelles are of particular importance.

Moreover, solar energy is an environmentally friendly green energy source. Converting solar energy into electrical energy is the focus of scientific research in various countries and the focus of development and promotion in industries. Compared with the inorganic solar batteries, the polymer solar battery has simple fabrication process, high operability, low cost, and light weight, and can be prepared into a flexible device. Therefore, the polymer solar battery has broad development and application prospects and is the most important research direction in the energy area.

Among various types of solar batteries, high-efficiency polymer solar batteries usually use a bulk heterojunction structure, that is, the polymer donor material forms an interpenetrating network structure with the acceptor material. The bulk heterojunction structure can increase the contact area between the donor and the acceptor, to overcome the defect of short diffusion distance of the excitons, and improve the efficiency of exciton separation and the efficiency of solar energy conversion. Moreover, due to the low utilization rate of solar energy, low mobility of free electrons, and high probability of electron-hole recombination in the polymer solar batteries, the light conversion efficiency of polymer solar batteries is still much lower than that of inorganic solar batteries. In the structure of a conventional polymer solar battery, increasing the thickness of a photoactive layer in the polymer solar battery can increase the absorption of light energy. However, due to the low mobility of the free charges, increasing the thickness of the photoactive layer in the cell will necessarily lead to decreased ability to export free charges, so the increased light energy cannot be efficiently converted into the electrical energy. Therefore, how to improve the absorption of light energy without increasing the thickness of the photoactive layer is an important research topic.

Organic rare earth solid micelles can absorb light energy, upon which electrons in 4f orbital transition to produce strong fluorescence; and have wide UV absorption range and can absorb more light energy, whereby the light absorption is increased without increasing the thickness of the photoactive layer of the polymer solar battery, so as to increase the photoelectric conversion efficiency of the polymer solar battery. At present, how to utilize the fluorescence performance of the organic rare earth solid micelle to improve the photoelectric conversion efficiency of the solar battery is of great research value, which also creates a new area for use of the rare earth luminescent material.

In the prior art, Chinese Patent No. 200910084684.7 discloses a method for treating a photoelectric active layer of a polymer solar battery, by exposing a photoactive layer to vapor of chloroform and/or o-dichlorobenzene for 0.1-20 hours. Although the method can effectively improve the photoelectric conversion efficiency of the solar battery, the photoactive layer is prone to oxidization in case of improper operation, so the structure of the photoactive layer is destroyed, and the electrical properties of the battery are affected. Chinese Patent No. 200910085656.7 discloses a method for preparing a photoactive layer of a polymer solar battery doped with an inorganic semiconductor nanocrystal, which comprises mixing an inorganic salt solution of Pb, Cd or Zn with o-dichlorobenzene, then spin coating to form a film, and treating the obtained film in an atmosphere for 10 to 120 minutes. In the method, an inorganic salt is introduced, the cost is increased, the stability is poor, and the network structure of the photoactive layer trends to be destroyed, whereby the photoelectric conversion efficiency is reduced. Chinese Patent No. 201410336868.9 discloses a high-efficiency polymer solar battery having a structure comprising, from top to bottom, a glass substrate, an FTO anode layer, a mesoporous nano-titania layer, a polymer active layer, and an aluminum cathode layer. In the preparation of such a structure, nanoparticles are disposed in the electron transport layer or the hole transport layer, which limit the surface plasma effect and affect the photoelectric conversion efficiency of the cell. So far, there are no reports and patents concerning the use of organic rare earth solid micelles in solar batteries. Therefore, it is particularly important to improve the photoelectric conversion efficiency of polymer solar batteries by using organic rare earth solid micelles without destroying the structure of the photoactive layer.

Chinese Patent No. 201210260336.2 also discloses a method for preparing a polymer-rare earth ion luminescent micelle. However, the polymer-europium ion micelle prepared therewith has a particle diameter of 100 nm or more. In the present invention, a novel amphiphilic diblock polymer and an organic conjugated small molecule 2-thenoyltrifluoroacetone are self-assembled and complexed with rare earth ions into microspheres, thus greatly reducing the size of the organic rare earth solid micelles (10-20 nm), and broadening the area of applications for later use in, for example, polymer solar batteries.

SUMMARY OF THE INVENTION

To overcome the shortcomings existing in the prior art, an object of the present invention is to provide a method for preparing a polymer solar battery having an organic luminescent material. An organic rare-earth solid micelle is spin coated on an ITO layer of a bulk heterojunction polymer solar battery (HJPSC), and the light absorption capability of the solar battery is increased by taking advantage of the fluorescence emission characteristic of the organic rare earth solid micelle, thereby improving the photoelectric conversion efficiency of the cell.

In order to achieve the above object, the preparation process of the present invention comprises the following steps.

A method for preparing an organic rare-earth solid micelle is provided, which comprises: taking a small organic conjugated ligand as a first ligand and an amphiphilic diblock polymer as a second ligand, mixing and doping the first ligand and the second ligand with a rare-earth chloride solution, and self-assembling so as to form an organic rare-earth solid micelle.

In the preparation method, the amphiphilic diblock polymer is polymethyl methacrylate-b-polyacrylic acid (PMMA-b-PAA).

In the preparation method, the polymethyl methacrylate-b-polyacrylic acid (PMMA-b-PAA) useful as the amphiphilic diblock polymer is prepared through a process comprising: (1) weighing an amount of a reversible addition fragmentation chain transfer agent (RAFT) and an appropriate amount of an initiator, dissolving in dioxane as a solvent, adding an amount of methyl methacrylate (MMA) monomer, and reacting for 8 hrs in an oil bath at 70° C. under a nitrogen atmosphere; and washing the reaction solution with petroleum ether, filtering with suction to obtain an upper solid, and drying the solid to obtain a first block polymer, and (2) weighing an amount of the product obtained in Step (1), adding an appropriate amount of an initiator, dissolving in dioxane as a solvent, adding an amount of acrylic acid monomer when polymethyl methacrylate is completely dissolved, and reacting for 6 hrs in an oil bath at 50° C. under a nitrogen atmosphere; and washing the prepared reaction solution with petroleum ether to remove the impurities and unreacted monomers, pouring an upper liquid to obtain a lower viscous solid, and drying to obtain the amphiphilic diblock polymer (PMMA-b-PAA).

In the preparation method, the rare-earth chloride solution includes an europium chloride, terbium chloride, thulium chloride, or gadolinium chloride solution.

In the preparation method, the small organic conjugated ligand is one of 2-thenoyltrifluoroacetone (TTA), 1,10-o-phenanthroline (Phen), acetylacetone, salicylic acid, or dibenzoyl methane (DBM).

In the preparation method, the molar ratio of small organic conjugated ligand:rare-earth chloride:amphiphilic diblock polymer is 3:1:1.

In the preparation method, the small organic conjugated ligand:rare-earth chloride:amphiphilic diblock polymer are subjected to complexation reaction for 5-10 hrs in an oil bath at 50-70° C., to obtain a solution of an organic rare-earth solid micelle that is a complex having a size of 10-20 nm.

An organic rare earth solid micelle obtained by any of the methods described is provided, which has a size of 10-20 nm, is spherical, has high fluorescence intensity, and has an UV absorption range of 300-425 nm.

A method for increasing the photoelectric conversion efficiency of a solar battery is provided, which comprises spin coating the prepared organic rare-earth solid micelle on an ITO layer of a solar battery, to prepare a solar battery with the organic rare-earth solid micelle, whereby the sunlight absorption of the cell is increased, and the photoelectric conversion efficiency is improved.

The method for increasing the photoelectric conversion efficiency of a solar battery comprises (1) ultrasonically washing a transparent substrate with an ITO anode electrode sequentially with a detergent, deionized water, acetone, deionized water, absolute ethanol and isopropanol, and drying by blowing with dry high-purity nitrogen or drying at a high temperature after washing, to form a clean conductive substrate; and then transferring the substrate to a plasma surface treatment apparatus, treating the ITO conductive substrate with plasma for 5-15 minutes under a pressure of 25 Pa under oxygen and nitrogen atmosphere, and then cooling to room temperature;

(2) diluting the organic rare-earth solid micelle solution with an organic polar solvent, and then dispersing fully by ultrasonication to obtain a uniformly dispersed organic rare earth solid micelle solution;

(3) forming a discontinuous island-like organic rare earth solid micelle layer by spin coating on the anode electrode of the ITO conductive substrate treated with plasma in Step (1);

(4) forming a conductive substrate with a hole transport layer by spin coating on a surface of the organic rare earth solid micelle layer obtained in Step (3);

(5) forming a photoactive layer on the hole transport layer of Step (4) by spin coating a donor material and an acceptor material by a spin coater; and (6) forming a cathode electrode on the photoactive layer of Step (5) by vapor deposition of a cathode electrode material, to obtain a polymer solar battery in which an organic rare earth solid micelle layer is spin-coated.

In a preferred embodiment of the present invention, the organic rare-earth solid micelle comprises a core-shell structure formed by coordination of a first ligand, a second ligand and trivalent rare earth ions, and has an average particle size ranging from 10 to 20 nm. The first ligand is 2-thenoyltrifluoroacetone, and the second ligand is polymethyl methacrylate-b-polyacrylic acid.

Preferably, the molar ratio of the first ligand:the trivalent rare earth ion:the second ligand is 3:1:1.

Preferably, the trivalent rare earth ion is $Eu^{3+}$, $Tb^{3+}$, $Tm^{3+}$, or $Gd^{3+}$.

In a preferred embodiment of the present invention, the anode electrode of the solar battery includes an indium tin oxide layer, and the aforementioned organic rare earth solid micelle is dotted on the indium tin oxide layer.

Preferably, the anode electrode is an indium tin oxide layer, and a light absorption layer comprises the organic rare earth solid micelle layer and the photoactive layer.

Preferably, the hole transport layer is a PEDOT:PSS polymer conductive polymer film.

The amphiphilic diblock polymer of the present invention has a first segment which is prone to polymerization in the presence of light, heat, ionizing radiation and a catalyst, with a high polymerization efficiency and a small degree of polymerization; has a second segment forming monomer that is easily polymerized in the presence of a catalyst; has the simplest unsaturated carboxyl group, ester group or amide group which can be coordinately complexed with the trivalent rare earth ion; and has a small degree of polymerization, so small solid micelle can be easily formed.

The organic rare earth solid micelle of the present invention has a core-shell structure, is of a spherical shape of relatively small size ranging from 10-20 nm, have a narrow size distribution, can be easily dispersed uniformly in a solar battery, and have a strong fluorescence intensity, and a wide UV absorption range between 300-425 nm.

The anode electrode mentioned in the present invention is a transparent conductive metal oxide or a doped metal oxide, including indium tin oxide (ITO), fluorine-doped tin oxide (FTO) and tin oxide, and the anode electrode is formed by vapor deposition or magnetron sputtering. The material of the anode electrode has a high transmittance over the wavelength range of visible light.

The organic rare earth solid micelle layer mentioned in the present invention is uniformly dispersed on the ITO layer in a dotted pattern, which can broaden and increase the absorption range and capability for light of the solar battery to avoid the damage to the structure of the photoactive layer, and has less impact on the current continuity.

The hole transport layer mentioned in the present invention is a PEDOT:PSS polymer conductive polymer film (where PEDOT is a polymer of 3,4-ethylenedioxythiophene monomer, and PSS is polystyrene sulfonate). The material of the hole transport layer has conductivity and a work function, and has a transmittance in the visible wavelength range.

The photoactive layer mentioned in the present invention comprises a polymer donor material and an acceptor material, and the two materials are mixed to form an interpenetrating network structure. The donor material absorbs light energy to generate excitons, and the donor material has a LUMO energy level higher than the LUMO energy level of the acceptor material. The excitons split at an interface between the donor material and the acceptor material, forming electrons and holes. The electrons are transported in the acceptor material, and the holes are transported in the donor material, to eventually reach the cathode and the anode respectively, thus forming a current and a voltage.

The polymer donor material mentioned in the present invention include polythiophenes (such as P3HT, PEOPT and P3OT, etc.), polyparaphenylene vinylene derivatives (such as MDMO-PPV and MEH-PPV, etc.) and DA-type conjugated polymer donor materials with narrow band gap (such as PBDTTT-CT, PCPDTBT, PBDTTPD, PNDT-BT, PBDFDTBT and PDTSTPD). The polymer donor material has a conjugated structure capable of absorbing light energy in visible light and undergoing electronic transition to form excitons. The acceptor material includes fullerene derivatives such as $PC_{61}BM$, $PC_{71}BM$, ICBA, and ICMA. The acceptor material can form a nano-interpenetrating network structure with the polymer donor material in the photoactive layer material, and has a different light absorption range from that of the polymer donor material.

The cathode material of the present invention comprises aluminum and calcium. The cathode electrode of the cell has conductivity and a low work function, and can form an internal electric field with the anode electrode having a high work function, which is favorable for the transfer of electrons and holes.

Compared with the prior art, the organic rare earth solid micelle is directly spin coated on the ITO layer in the present invention to form a single layer, which increases the light absorption range and efficiency of the cell. The size of the solid micelle is reduced and the dispersion on the ITO layer is improved, which effectively reduces the impact on current continuity. Low concentration of organic rare earth solid micelle will not destroy the bulk heterojunction structure of the polymer solar batteries, so that the battery maintains a relatively high fill factor. The present invention has the advantages of high light conversion efficiency, simple preparation process, low cost and environmental friendliness.

In the present invention, the prepared organic rare earth solid micelle having a core-shell structure is used in a solar battery, and the photoelectric conversion efficiency of the solar battery is improved by doping in the active layer or spin coating on the ITO layer of the solar battery. The organic rare earth solid micelle can be uniformly dispersed in the coating of the cell in a discontinuous dotted pattern, thus having little influence on the current continuity. Moreover, the organic rare earth solid micelle is of a spherical shape of relatively small size ranging from 10-20 nm, has a narrow size distribution, and have a strong fluorescence intensity, and a wide UV absorption range between 300-425 nm.

In the organic rare earth solid micelle according to the present invention, an organic conjugated small molecule having an energy level best matching with the rare earth ions is used as a first ligand, and a block polymer capable of being self-assembling into micelles by coordination and complexation with the organic conjugated small molecule is used as a second ligand. After the organic conjugated small molecule is complexed with the rare earth ions by coordination, the absorbed energy is excited to a certain vibrational energy level of the singlet state, and then the molecule transitions to a slightly lower vibrational energy level of the singlet state through the rapid internal energy transfer. The singlet state will be crossed to the triplet state by means of non-radiative intersystem crossing, and the triplet state undergoes non-radiative transition to an excited state of the rare earth ions. Through an energy transfer-like indirect excitation, the rare earth ions radiatively transition to the 4f shell with a lower energy level and emit strong fluorescence.

The hole transport layer mentioned in the present invention is a PEDOT:PSS polymer conductive polymer film or a metal oxide film, including nickel oxide, vanadium oxide, molybdenum oxide and copper phthalocyanine. The material of the hole transport layer has conductivity and a work function, and has a transmittance in the visible wavelength range.

The organic rare earth solid micelle of the present invention can absorb light in the ultraviolet spectrum in sunlight. On the one hand, the irradiation of UV light on the photoactive layer can be reduced to prolong the life of the photoactive layer, and improve the stability of the cell. On the other hand, the mixture of the narrow-band polymer donor material and the acceptor material in the photoactive layer can form an interpenetrating network structure. The addition of the organic rare earth solid micelle can increase the light absorption capability of the cell. The polymer donor material absorbs large quantities of light energy to generate excitons. The excitons split at an interface between the donor material and the acceptor material, forming electrons and holes. The electrons are transported in the acceptor material, and the holes are transported in the donor material, to eventually reach the cathode and the anode respectively, thus forming a current and a voltage.

DETAILED DESCRIPTION OF THE PREFERRED EMBODIMENTS

Hereinafter, the present invention is described in detail by way of specific examples.

Example 1: Synthesis of Amphiphilic Diblock Polymer (Polymethyl Methacrylate-b-Polyacrylic Acid) (PMMA-b-PAA)

(1) Preparation of first block polymer polymethyl methacrylate (PMMA): An amount of a reversible addition fragmentation chain transfer agent (RAFT) and an appropriate amount of an initiator were weighed, and dissolved in dioxane as a solvent. An amount of methyl methacrylate (MMA) monomer was added, and reacted for 8 hrs in an oil bath at 70° C. under a nitrogen atmosphere. The reaction solution was washed with petroleum ether, and filtered with suction to obtain an upper solid, and the solid was dried to obtain a first block polymer.

(2) Synthesis of amphiphilic diblock polymer polymethyl methacrylate-b-polyacrylic acid (PMMA-b-PAA): An amount of the product obtained in Step (1) was weighed, added with an appropriate amount of an initiator, and dissolved in dioxane as a solvent. An amount of acrylic acid monomer was added when polymethyl methacrylate was completely dissolved, and reacted for 6 hrs in an oil bath at 50° C. under a nitrogen atmosphere. The prepared reaction solution was washed with petroleum ether to remove the impurities and unreacted monomers. An upper liquid was poured out to obtain a lower viscous solid, which was then dried to obtain the amphiphilic diblock polymer (PMMA-b-PAA).

Figure 1:
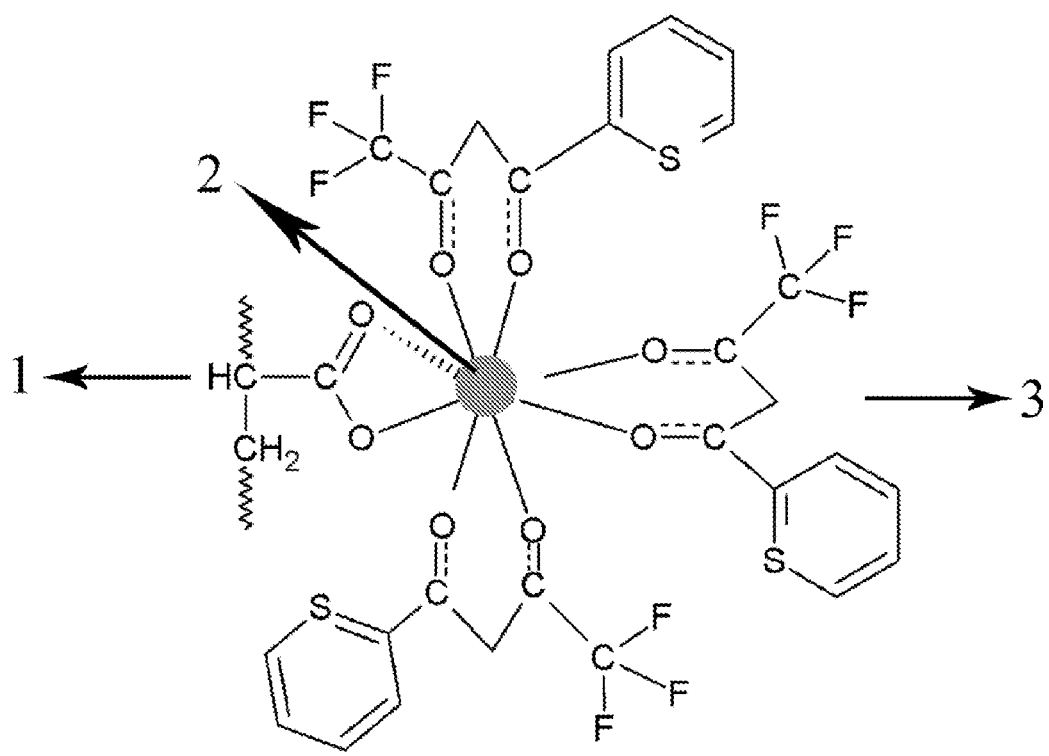
FIG. 1 is a schematic view showing the structure of an organic rare earth solid micelle according to Example 2 of the present invention, which comprises 1. an amphiphilic diblock polymer, 2. trivalent europium ions, and 3. 2-thenoyltrifluoroacetone.

Example 2: Preparation of Organic Rare-Earth Solid Micelle Solution (FIG. 1)

(1) Preparation of rare earth ion solution: An amount of europium oxide was subjected to a metathesis reaction with an excess of an aqueous hydrochloric acid solution with stirring for 1 hour. The reaction solution was crystallized by evaporating in an oil bath at 70° C. to remove the solvent, washed with tetrahydrofuran and then dried to obtain $EuCl_3 \cdot 6H_2O$. N,N-dimethylformamide (DMF) was used as a solvent, into which the dried crystal $EuCl_3 \cdot 6H_2O$ was dissolved to prepare a 0.02 mol/L europium chloride solution.

(2) Formulation of amphiphilic diblock polymer solution: The amphiphilic diblock polymer prepared in Example 1 was dissolved in N,N-dimethylformamide (DMF), to formulate a 0.04 mol/L polymer solution.

(3) Preparation of organic rare-earth solid micelle: A suitable amount of a small organic conjugated ligand 2-thenoyltrifluoroacetone (TTA, as a first ligand) and a suitable amount of the polymer solution obtained in Step (2) (as a second ligand) were complexed for 5 hrs with the europium chloride solution prepared in Step (2) at a molar ratio of 3:1:1 (TTA:chloride:diblock polymer) in an oil bath at 50° C., to obtain an organic rare-earth solid micelle solution, where the organic rare-earth solid micelle was a complex having a size of 10-20 nm.

Example 3: Preparation of Organic Rare-Earth Solid Micelle Solution

Figure 2:
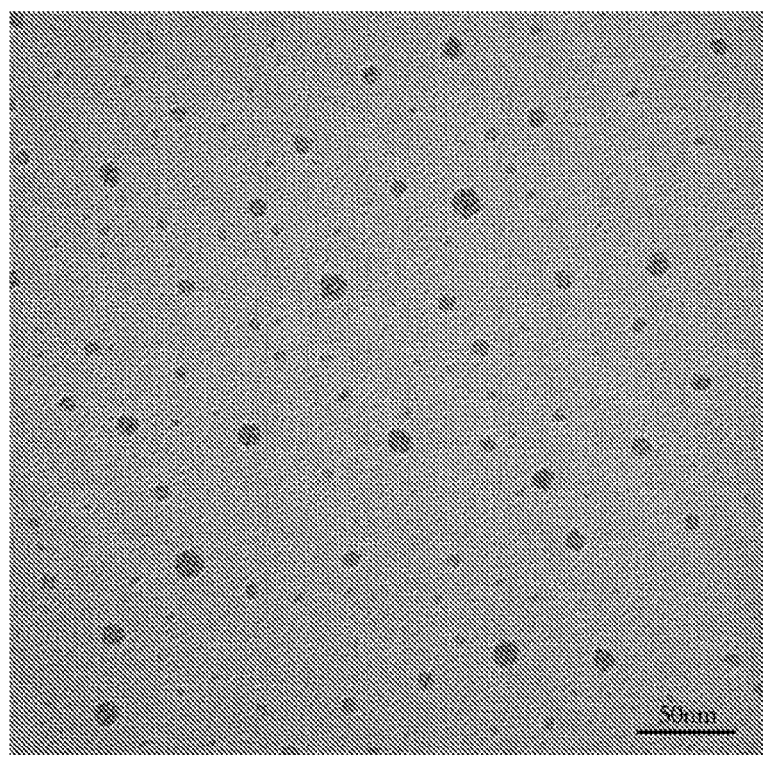
FIG. 2 is a transmission electron micrograph of an organic rare earth solid micelle according to Example 3 of the present invention.

In this example, the organic rare-earth solid micelle was chemically synthesized through a method comprising the following steps. 0.02667 g of TTA was weighed, placed in a round-bottom flask, and well dissolved in 17 mL of o-dichlorobenzene by stirring. Then, 1 mL of 0.04 mol/L amphiphilic diblock polymer solution ($PMMA_{20}$-b-$PAA_{10}$) was added dropwise to the round-bottom flask containing TTA, and finally, 2 mL of 0.02 mol/L europium chloride solution was added dropwise to the round-bottom flask. Subsequently, the round-bottom flask was placed in an oil bath at 60° C., and the reaction was continued for 7 hrs by stirring with heating, to ultimately obtain a solution of an organic rare-earth solid micelle having a particle size of about 13 nm (FIG. 2).

Figure 3:
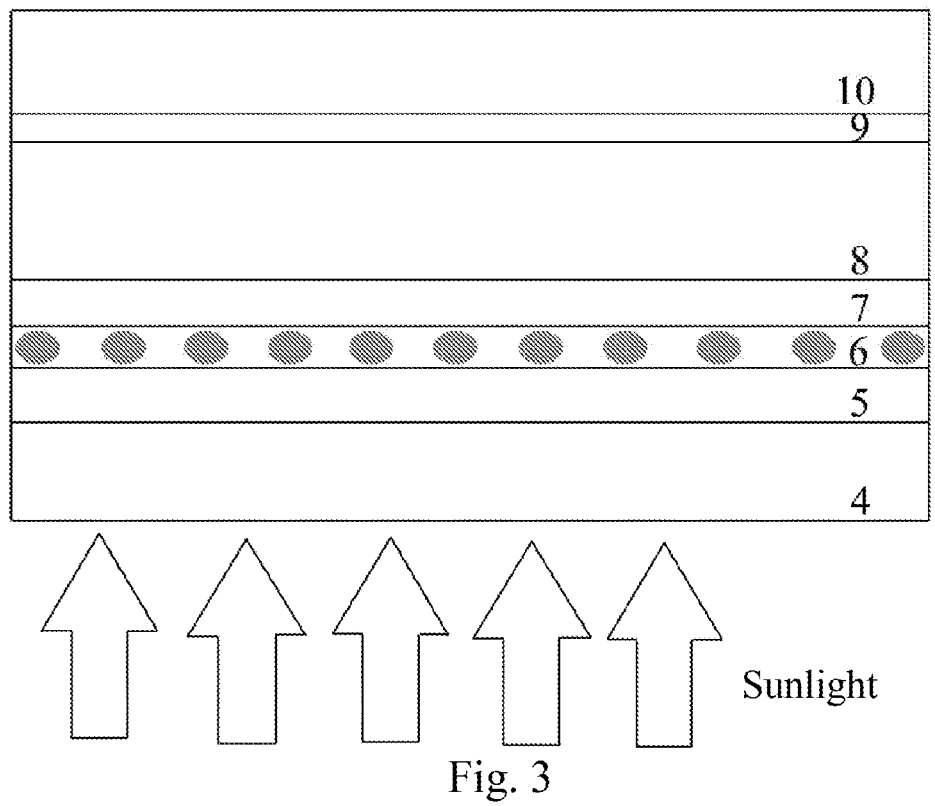
FIG. 3 is a schematic view showing the structure of a solar battery according to Example 4 of the present invention, which includes 4. a transparent glass substrate, 5. an anode electrode ITO layer, 6. organic rare earth solid micelle, 7. a hole transport layer, 8. a photoactive layer, 9. an electron buffer layer, and 10. a cathode electrode.

Example 4: Preparation of Solar Battery (FIG. 3)

The solar battery prepared in this example has a body structure including a transparent glass substrate 4, an anode electrode ITO layer 5, an organic rare-earth solid micelle layer 6, a hole transport layer 7, a photoactive layer 8, an electron buffer layer 9, and a cathode electrode 10. The anode electrode ITO layer 5 has a thickness of 180 nm; the uniformly dispersed organic rare-earth solid micelle layer 6 has a thickness of 30-50 nm; the hole transport layer 7 is a PEDOT:PSS polymer conductive film having a thickness of 30 nm; the donor material in the photoactive layer 8 is a BDT-based narrow-band polymer PBDTTT-C-T, the acceptor material is a fullerene derivative ($PC_{71}BM$), and the thickness of the photoactive layer is 100 nm; the material of the electron buffer layer is calcium, and the thickness is 10 nm; and the cathode electrode is aluminum, and the thickness is 100 nm.

The preparation process in this example comprises the following steps.

(1) A transparent substrate with an ITO anode electrode was ultrasonically washing sequentially with a detergent, deionized water, acetone, deionized water, absolute ethanol and isopropanol, and dried by blowing with dry high-purity nitrogen or dried at a high temperature after washing, to form a clean conductive substrate. Then the substrate was transferred to a plasma surface treatment apparatus, and the ITO conductive substrate was treated with plasma for 6 minutes under a pressure of 25 Pa under oxygen and nitrogen atmosphere, and then cooled to room temperature.

(2) The organic rare-earth solid micelle solution obtained in Example 3 was 1:1 diluted with o-dichlorobenzene, to form a 0.001 mol/L solution which was then treated by ultrasonication to obtain a well dispersed solution in a mixed solvent.

(3) The ITO conductive glass obtained in Step (1) was placed in a spin coater, and spin coated for 40 s with the organic rare-earth solid micelle treated in Step (2) at a rotational speed of 2000 rpm, to finally obtain a light absorption layer of organic rare-earth solid micelle having a thickness of about 20 nm.

(4) The spin-coated glass with an organic rare-earth solid micelle layer obtained in Step (3) was placed in a spin coater, and spin coated for 40 s with a polyelectrolyte conductive material PEDOT:PSS at a rotational speed of 4000 rpm, to finally obtain a hole transport layer (polymer conductive film) having a thickness of about 30 nm, which was then thermally treated at 150° C. for 20 min.

(5) The polymer conductive film obtained in Step (4) was placed in a spin coater, and spin coated for 60 s with a 25 mg/mL solution of PBDTTT-C-T and $PC_{71}BM$ (weight ratio 1:1.5) in o-dichlorobenzene at a rotational speed of 800 rpm.

(6) The glass substrate treated in Step (5) was placed in an evaporation deposition apparatus with a vacuum level of greater than $5 \times 10^{-4}$ Pa, and an electron buffer layer and a cathode electrode were formed by evaporation deposition, where the material of the electron buffer layer is Ca, the evaporation deposition rate is 0.01 nm/s, and the thickness is 10 nm; and the material of the cathode electrode is Al, the evaporation deposition rate is 0.5 nm/s, and the thickness is 100 nm. The evaporation deposition rate and thickness were monitored by a quartz crystal oscillator monitoring the film thickness which has a probe mounted around the substrate.

Example 5: Preparation of Solar Battery

Figure 4:
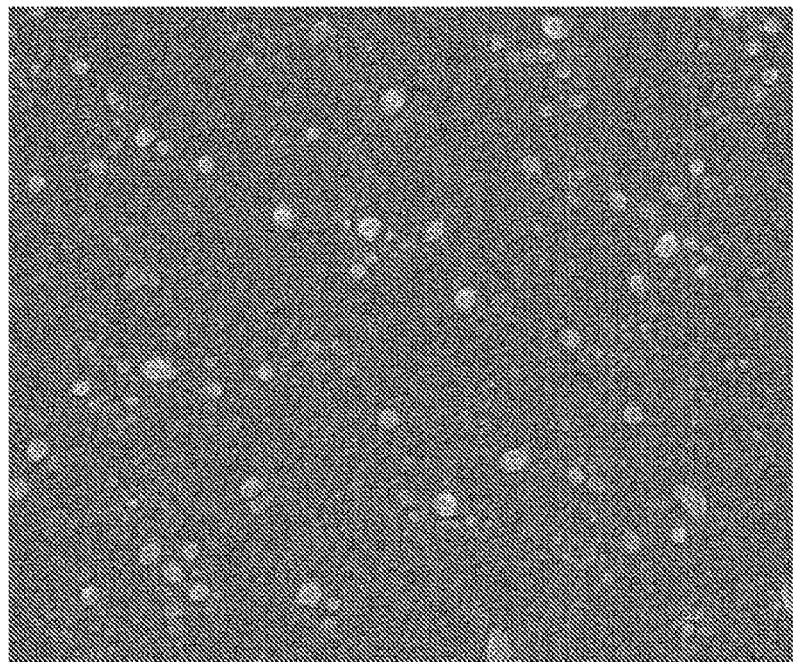
FIG. 4 is a view showing a state of distribution of an organic rare earth solid micelle according to Example 5 of the present invention on an ITO layer in a solar battery.
Figure 5:
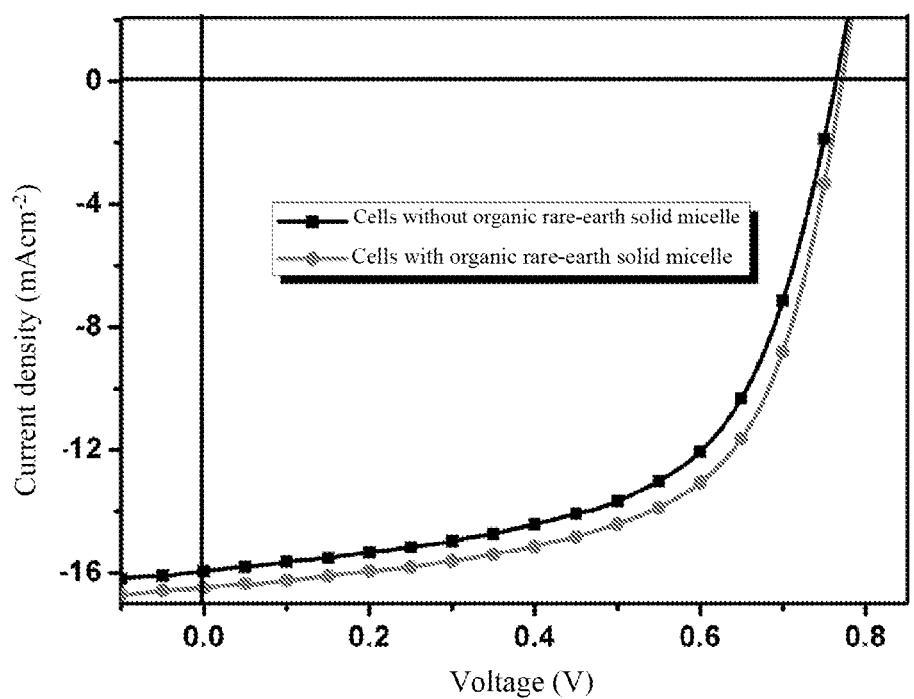
FIG. 5 shows curves of voltage vs current density of a solar battery and a reference solar battery according to Example 5 of the present invention.

The preparation process steps in this example were the same as those in Example 4. Step (2) in this example differed from that in Example 4 in that the ratio of the organic rare-earth solid micelle solution to the solvent o-dichlorobenzene was 1:3, and the preparation method was as follows. The obtained organic rare-earth solid micelle solution was stirred with the solvent o-dichlorobenzene at a ratio of 1:3, to disperse the solid micelle uniformly, and then spin coated on the ITO layer to prepare a light absorption layer (FIG. 4).

The photoelectric conversion efficiency of the spin-coated polymer solar battery with the organic rare earth solid micelle prepared in this example is 7.84% (FIG. 4), which is increased by about 10% compared with the photoelectric conversion efficiency (7.25%) of the polymer solar battery without the organic rare earth solid micelle, and is 98% higher than the photoelectric conversion efficiency (3.96%) of the improved solar battery in Chinese Patent No. 201410336868.9. The improvement on the energy conversion efficiency is mainly manifested as increased short-circuit current, with the open circuit voltage and the fill factor having no obvious changes.

Example 6: Preparation of Solar Battery

The preparation process steps in this example were the same as those in Example 4. Step (2) in this example differed from that in Example 4 in that the ratio of the organic rare-earth solid micelle solution to the solvent o-dichlorobenzene was 1:7, and the preparation method was as follows. The obtained organic rare-earth solid micelle solution was stirred with the solvent o-dichlorobenzene at a ratio of 1:7, to disperse the solid micelle uniformly, and then spin coated on the ITO layer to prepare a light absorption layer.

It is to be understood that modifications and changes can be made by those skilled in the art in accordance with the above description, which are intended to be contemplated in the protection scope of the appended claims.

The invention claimed is:

1. A method for preparing an organic rare-earth solid micelle, comprising: taking a small organic conjugated ligand as a first ligand and an amphiphilic diblock polymer as a second ligand, mixing and doping the first ligand and the second ligand with a rare-earth chloride solution, and self-assembling to form an organic rare-earth solid micelle;
wherein the amphiphilic diblock polymer is polymethyl methacrylate-b-polyacrylic acid (PMMA-b-PAA),
the molar ratio of the small organic conjugated ligand: rare-earth chloride:amphiphilic diblock polymer is 3:1:1,
wherein the small organic conjugated ligand:rare-earth chloride:amphiphilic diblock polymer are subjected to complexation reaction for 5-10 hrs in an oil bath at 50-70° C., to obtain a solution of an organic rare-earth solid micelle that is a complex having a size of 10-20 nm.

2. The preparation method according to claim 1, wherein the polymethyl methacrylate-b-polyacrylic acid (PMMA-b-PAA) useful as the amphiphilic diblock polymer is prepared through a process comprising: (1) weighing an amount of a reversible addition fragmentation chain transfer (RAFT) agent and an appropriate amount of an initiator, dissolving the RAFT agent and initiator in dioxane as a solvent, adding an amount of methyl methacrylate (MMA) monomer, and reacting for 8 hrs in an oil bath at 70° C. under a nitrogen atmosphere to obtain a first reaction solution; and washing the first reaction solution with petroleum ether, filtering with suction to obtain an upper solid, and drying the upper solid to obtain a first polymer; and (2) weighing an amount of the first polymer obtained in Step (1), adding an appropriate amount of an initiator, dissolving the first polymer and initiator in dioxane as a solvent, adding an amount of acrylic acid monomer when the first polymer is completely dissolved, and reacting for 6 hrs in an oil bath at 50° C. under a nitrogen atmosphere to obtain a second reaction solution; and washing the second reaction solution with petroleum ether to remove impurities and unreacted monomers, pouring an upper liquid to obtain a solid, and drying to obtain the amphiphilic diblock polymer (PMMA-b-PAA).

3. The preparation method according to claim 1, wherein the rare-earth chloride solution comprises europium chloride, terbium chloride, thulium chloride or gadolinium chloride.

4. The preparation method according to claim 3, wherein the small organic conjugated ligand is 2-thenoyltrifluoroacetone.

5. The preparation method according to claim 3, wherein the small organic conjugated ligand is one of 1,10-o-phenanthroline, acetylacetone, salicylic acid, or dibenzoyl methane.

\* \* \* \* \*